(12) United States Patent
Bullwinkel

(10) Patent No.: US 8,985,780 B2
(45) Date of Patent: Mar. 24, 2015

(54) LIQUID COOLED VIDEO PROJECTOR

(71) Applicant: Avotec, Inc., Stuart, FL (US)

(72) Inventor: Paul E. Bullwinkel, Stuart, FL (US)

(73) Assignee: Avotec, Inc., Stuart, FL (US)

( * ) Notice: Subject to any disclaimer, the term of this patent is extended or adjusted under 35 U.S.C. 154(b) by 144 days.

(21) Appl. No.: 13/887,047

(22) Filed: May 3, 2013

(65) Prior Publication Data

US 2013/0293852 A1    Nov. 7, 2013

Related U.S. Application Data

(60) Provisional application No. 61/642,336, filed on May 3, 2012.

(51) Int. Cl.
*G03B 21/16* (2006.01)
*G01R 33/28* (2006.01)
*G01R 33/48* (2006.01)

(52) U.S. Cl.
CPC .............. *G03B 21/16* (2013.01); *G01R 33/283* (2013.01); *G01R 33/4806* (2013.01)
USPC .............................. 353/54; 362/218; 362/373

(58) Field of Classification Search
USPC ............. 353/54; 362/218, 373; 382/600–607; 361/677, 689, 702, 703
See application file for complete search history.

(56) References Cited

U.S. PATENT DOCUMENTS

| | | | |
|---|---|---|---|
| 5,414,459 A | 5/1995 | Bullwinkel | |
| 5,864,331 A | 1/1999 | Anand et al. | |
| 5,892,566 A | 4/1999 | Bullwinkel | |
| 6,079,829 A | 6/2000 | Bullwinkel | |
| 6,774,929 B1 | 8/2004 | Kopp | |
| 7,359,026 B2 | 4/2008 | Bullwinkel et al. | |
| 2004/0257538 A1 | 12/2004 | Kondo et al. | |
| 2005/0201107 A1 | 9/2005 | Seki | |
| 2007/0103647 A1 | 5/2007 | Egawa et al. | |
| 2010/0073637 A1 | 3/2010 | Matsumoto et al. | |

*Primary Examiner* — William C Dowling
(74) *Attorney, Agent, or Firm* — McHale & Slavin, P.A.

(57) ABSTRACT

Disclosed is a liquid cooling system for use with MRI positioned video projectors to dissipate heat from the projector light source through liquid cooling. The system includes a heat sink body for mounting to the projector light source, the heat sink body constructed of a material to transfer heat away from the projector light. A remotely mounted motor-driven pump provides fluid circulation, the pump is constructed and/or mounted so as to not to be effected by the MRI magnetic field. The pump is coupled to the heat sink block by use of flexible tubing that is constructed and arranged to provide heat transfer to the environment thereby maintaining the projector light source temperature at a reduced level. A liquid reservoir is fluidly coupled to the pump intake for use in maintaining liquid levels at an optimum position.

20 Claims, 2 Drawing Sheets

LIQUID COOLED VIDEO PROJECTOR

PRIORITY CLAIM

In accordance with 37 C.F.R. 1.76, a claim of priority is included in an Application Data Sheet filed concurrently herewith. Accordingly, under 35 U.S.C. §119(e), 120, 121, and/or 365(c) the present invention claims priority to U.S. Provisional Application No. 61/642,336, entitled "LIQUID COOLED VIDEO PROJECTOR", filed May 3, 2012. The contents of which the above referenced application is incorporated herein by reference.

FIELD OF THE INVENTION

This invention relates to video projectors and in particular to an improved video projector apparatus for cooling a video projection system placed adjacent to a magnetic resonance imaging (MRI) system.

BACKGROUND INFORMATION

Magnetic Resonance Imaging (MRI) is a diagnostic device for use in imaging and exploring the internal body without surgery. An MRI has the ability to distinguish healthy and diseased tissue, fat and muscle, and between adjacent structures within the body which other modalities cannot demonstrate.

In operation, a typical MRI apparatus relies upon hydrogen protons which have a dipole movement and therefore behave as would a magnetic compass. The MRI apparatus operates as a large magnet wherein the protons align with the strong magnetic field but are easily disturbed by a brief radio frequency pulse of very low energy so as to alter their alignment. As the protons return to their orientation with the magnetic field, they release energy of a radio frequency that is strongly influenced by the biochemical environment. The released energy is detected and mathematically analyzed for display as a two dimensional proton density image according to the signal intensity of each tissue.

The magnetic coils of a conventional MRI apparatus are permanently fixed within a structure so as to form a large magnet. A patient is placed upon a scanner table that is integrated with the MRI apparatus and slid into the middle of the magnet, namely the bore. A problem with the bore is the extremely small area for placement of the patient and this leads to anxiety. The large and ominous appearance of the scanner together with harsh low monotone sounds which include both soft and loud thumping, produces an eerie and unnatural experience for the patient. Any patient who exhibits claustrophobic tendencies could require sedation before entering the bore. If the patient is above average in size, the problem is exasperated.

It is well known that familiarity of surroundings reduces anxiety. The introduction of familiar images to a person placed within a confining area, such as the MRI bore, will reduce if not eliminate anxiety and certain claustrophobic tendencies of various patients. This reduction can eliminate the need for medicating the patient or the need for a restraining device, all of which may have an adverse effect on a diagnostic test. Thus, a patient who is able to listen to a family member, soft music, or watch a familiar television program will have sufficient distractions so as to avoid concentrating on the immediate surroundings which lead to increased anxiety. In some instances, the diagnostic procedure performed with the MRI is used to evaluate a patient's response to specific visual stimuli. The operator sends a series of images to a screen which is seen by the patient during the MRI procedure and the patient's responses are included in the MRI report. Typically the projector is used with a screen that is located inside the MRI bore near the patient's head.

A problem with introducing conventional audio or video signals into an MRI apparatus is that the MR imager is based upon the use of radio frequencies which will disrupt the audio or video signals. Further, the bore produces a magnetic field which will attract ferro-magnetic metals. Furthermore, the devices that generate the audio and video signals must not interfere with the imaging process. The Applicant has been granted a number of patents which address audio and video signals around an MRI including U.S. Pat. Nos. 5,414,459; 5,892,566; 6,079,829; 6,774,929; and 7,359,026.

The placement of a video projector close to the MRI is the most desirable for operational reasons. However, the magnetic field from the MRI causes problems with the operation of a video projector. The Applicant previously resolved these problems by development of a magnetically inert and RF shielded projector that utilized solid state lighting and an air cooling system. However, the high heat fluxes of modern projectors, coupled with a need for a physically compact MRI-compatible projector, made these designs inadequate, and resulted in inadequate cooling and premature failure of the video projector.

Projector technology is typically based on LCD, LCOS or DLP image generation devices. Each of these devices generates images by modulating some type of light source such as LEDs or filament lamps. A common characteristic of these light sources is that they generate considerable amounts of heat. If this heat is not dissipated, the light source, image generation device or the projector electronics will be adversely affected.

What is needed in the art is a cooling system for this projector technology that operates near an MRI environment.

SUMMARY OF THE INVENTION

The present invention satisfies this need by teaching a water cooled projector for use adjacent an MRI bore that permits proper cooling of the LCOS, LDP, LED, or the like based projector engine. The liquid cooling apparatus of the instant invention provides a means for direct dissipation of heat from the projector light through a heat sink body that is coupled to a remotely mounted fluid circulation system.

The heat sink body is constructed of a material to transfer heat away from the projector light. The circulation system is a remotely positioned motor driven pump that is positioned at a distance that is not affected by the MRI magnet to provide fluid circulation. In the preferred embodiment the pump is magnetically shielded and/or mounted outside the MRI magnetic field so as not be adversely affected by the field. The pump is coupled to the heat sink block by use of flexible tubing that is constructed and arranged to provide a heat transfer effect to the environment thereby maintaining the projector temperature at a reduced level. The tubing, heat sink construction, and pump size is calculated to provide proper heat dissipation from the light source to meet and exceed the manufactures recommend temperature level.

A liquid reservoir can be coupled to the pump intake for use in maintaining liquid levels at an optimum level to address evaporative losses and remove gas cavities.

Yet still another objective of the instant invention is to provide an apparatus for liquid cooling specifically for use with LCD, LCOS and DLP image generators' light sources.

Yet another objective of the instant invention is to provide a projector that is magnetically inert and can be cooled without a motorized fan.

An objective of the instant invention is to provide a video projector having a cooling system for proper cooling of the LCOS, LDP, LED, or the like imaging chip while operating within the magnetic field of an MRI apparatus.

Other objectives and advantages of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objects and features thereof.

DETAILED DESCRIPTION OF THE PREFERRED EMBODIMENT

Figure 1:
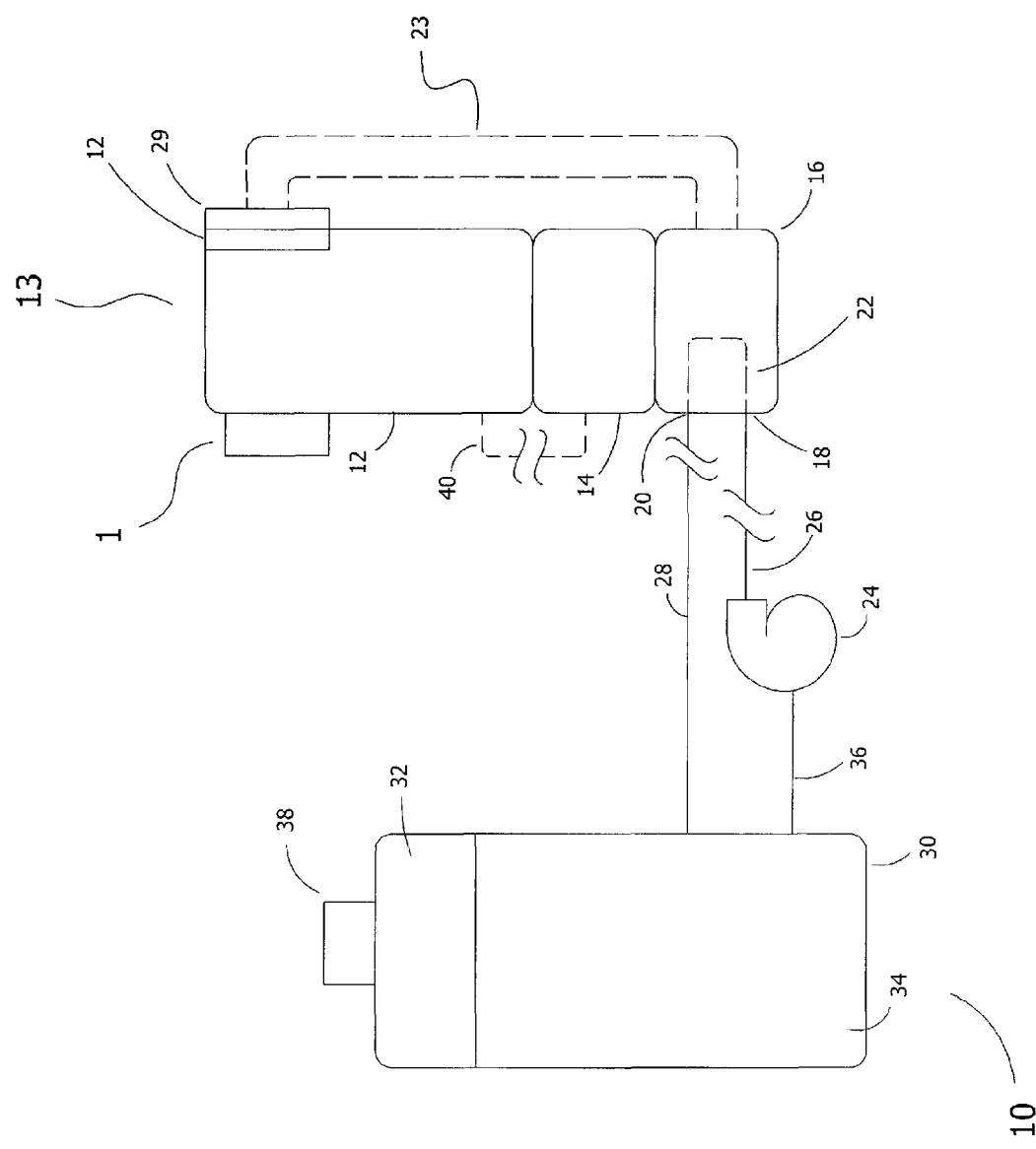
FIG. 1 is a flow schematic of the system.

Referring now to the Figures in general, set forth is a liquid cooled system 10 for use with a video projector 1 installed adjacent to an MRI apparatus. The system 10 includes a heat sink block 16 constructed from a heat collecting material, on which the projector light 14 is mounted. In the preferred embodiment the heat collecting material is copper. It should be noted that most any material can be used that is capable of transferring heat between the projector light and the liquid circulation system, including aluminum or plastic.

The use of a water cooled projector allows the projector to be placed adjacent to an MRI bore and permits proper cooling of the LCOS, LDP, LED, or the like optical engine without the need for a cooling fan. Conventional cooling fans that employ magnetic drives are inoperative within the MRI field. The liquid cooling apparatus of the instant invention provides a means for direct dissipation of heat from the projector light through a remotely mounted fluid circulation system.

The heat sink block 16 has an inlet 18 and an outlet fluidly coupled to an internal chamber 22. The internal chamber is constructed so as to most efficiently transmit heat from the heat sink block to the liquid passing through the chamber. The chamber may include baffles to increase contact time allowing for sizing of the quantity of fluid necessary to reduce the temperature of the projector light leading to longer life of the projector assembly and higher quality picture and resolution.

A pump 24 positioned remotely from the heat sink block by outtake tubing 26 connected to the heat sink block. Liquid is pumped through the heat sink block which absorbs heat from the thermally coupled projector light; the liquid is recirculated through return tubing 28. The tubing for the intake and outtake may be ten to over ninety feet long, depending upon the location of the pump in relation to the projector, and the amount of heat to be dissipated. Outtake tubing 26 and return tubing 28 are sized and constructed to complement each other on heat transfer, the return tubing 28 having a higher heat output directly after the heat sink block 16, the outtake tubing 26 having a lesser heat transfer as a portion of the heat would have been dissipated, but is still sized to assure that proper heat transfer has occurred before reintroduction into the heat sink block. The pump can be a conventional magnetic drive pump as the pump will be remotely mounted, or sufficiently shielded, from the MRI magnetic field.

In the preferred embodiment, the pump is separated from the video projector source from the MRI field by ten feet. The flow of the tubing can be vertical to an overhead passage way and then drop down to the location of the pump, wherein the tubing could exceed ninety feet in length. If proper magnetic shielding is used, the pump can be operated at the magnet. In this case, heat dissipative may be by use of excess tubing or a radiator type device could be used in place of the long tubing length.

A liquid reservoir 30 is used to eliminate entrained air by allowing liquid flow into an upper portion 32 of the reservoir. The return tubing 28 is coupled to the reservoir 30 along the lower portion 32; the lower portion 34 maintains a flooded section for the pump 24 which is fluidly coupled by suction line 36. The liquid reservoir is designed to eliminate air from being drawn into the pump and preferably allows visual viewing of the liquid level. A fill port 38 is positioned along the top of the reservoir for filling or replenishing of liquid. The liquid can be any form of fluid capable of heat transfer, including water.

The projection light 14 mounted on top of the heat sink block 16 permits use of liquid cooled heat transfer wherein heat from said projector light is drawn into the heat sink block and the heat is dissipated elsewhere through liquid circulation. The heat transfer permits proper cooling of the LCOS, LDP, LED, or the like projector engine without the need for a cooling fan. Further, the positioning of the heat sink block within the projector housing allows for cooling of the associated electronics 25. Further, a heat sink 29 can be attached to the image generator 12 and a thermal bridge 23 that is coupled to the heat sink block 16 providing cooling for the image generator.

Figure 2:
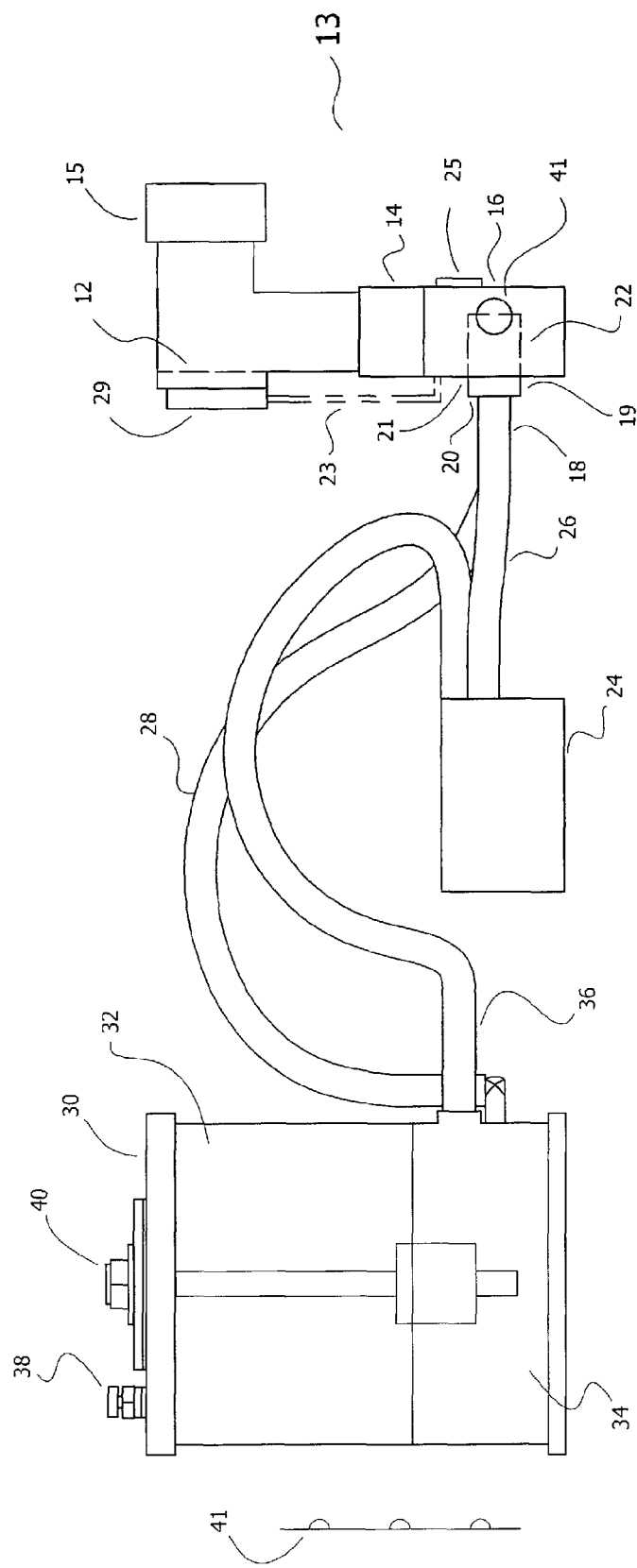
FIG. 2 is a pictorial flow schematic of the system components.

Referring to FIG. 2, illustrated is the liquid cooled system components illustrating projector light 14 installed on heat sink block 16. The heat sink block 16 has an inlet 18 and an outlet 20 fluidly coupled to an internal chamber 22, the internal chamber in this embodiment is a cross drilled aperture having end plugs. The internal chamber is constructed to most efficiently transfer heat to the circulating water.

A pump 24 is positioned remotely from the heat sink block 16 by outtake tubing 26. The tubing can be sized according to accommodate flow rates for purposes of heat transfer and fluid pressure. For instance, ¼ inch tubing can be used for most applications where the ambient temperature is at or below 25'C and a copper based heat sink block is employed. Outtake tubing 26 and return tubing 28 are sized and constructed to complement each other on heat transfer, the return tubing 28 having a higher heat output directly after the heat sink block 16, the outtake tubing 26 having a lesser heat transfer as a portion of the heat would have been dissipated but is still sized to assure that proper heat transfer has occurred before reintroduction into the heat sink block.

The liquid reservoir 30 is sized to eliminate entrained air by allowing liquid flow along an upper portion 32 of the reservoir. The liquid reservoir is sized and constructed to eliminate air from being drawn into the pump and is preferably constructed of a vessel that allows visual viewing of the liquid level. In this embodiment, an air vent and overflow port 38 is positioned along the top of the reservoir to aid in filling or replenishing of liquid. Additionally, a float sensor 40 is used to monitor the liquid level in the reservoir. Also included is a backlight 41 situated so as to aid in discerning the fluid level in the reservoir, said backlight also equipped to provide visual indication of the fluid level.

Fluid line 18 includes a quick release coupling 19 for ease of installation, similarly fluid line 20 includes a quick release coupling 21 also for ease of installation. The end cap 41 for the cross drill line is depicted. An adjustable lens 15 of the projector provides a means for adjusting and focusing the image generated by the optical engine By means of the construction set forth above, liquid in the reservoir coupled with the operation of the water pump, the apparatus can continuously and rapidly carry the thermal energy generated by the projector light and can discharge the thermal energy through the tubing to the exterior. Thus the invention can effectively disperse heat of the projector light through a liquid cooling fashion to a level that enhances the life of the LCOS, LDP, LED, or the like optical engine. Moreover, the whole system may be made in a compact size to better use the interior space of the projector by eliminating the conventional fan cooling system and the projector enjoys the benefits of liquid cooling apparatus which provides a more uniform heat transfer.

Detailed embodiments of the instant invention are disclosed herein, however, it is to be understood that the disclosed embodiments are merely exemplary of the invention, which may be embodied in various forms. Therefore, specific functional and structural details disclosed herein are not to be interpreted as limiting, but merely as a basis for the claims and as a representation basis for teaching one skilled in the art to variously employ the present invention in virtually any appropriately detailed structure.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. An apparatus for use in cooling a video projector light source in an MRI environment, the apparatus comprising:
    a heat sink block having an internal chamber with an inlet and an outlet, said heat sink block constructed and arranged for securement to a video projector light source mounted within a video projector housing;
    a fluid pump remotely positioned from said video projector housing, said fluid pump having an outtake coupled to said heat sink block input, and pump intake coupled to said heat sink output; and
    a pump motor electrically coupled to said video projector to cause operation of said pump for recirculating fluid between said pump and heat sink block when the video light source is operating;
    wherein heat from a projector light source secured to said heat sink block is transferred to the fluid and dissipated during the recirculation of the fluid.

2. The apparatus for liquid cooling a video projector according to claim 1 wherein said projector light source is a LCOS, LDP, LED, or the like optical engine.

3. The apparatus for liquid cooling a video projector according to claim 1 including a liquid reservoir defined by an upper section and a lower section, said lower section having an inlet for coupling to said heat sink and an outlet for coupling to said pump.

4. The apparatus for liquid cooling a video projector according to claim 3 wherein said fluid reservoir upper section is constructed to eliminate air from the recirculation.

5. The apparatus for liquid cooling a video projector according to claim 3 wherein said liquid reservoir includes a view port for determining fluid capacity.

6. The apparatus for liquid cooling a video projector according to claim 3 wherein said liquid reservoir includes a fill port for replenishing of liquid.

7. The apparatus for liquid cooling a video projector according to claim 1 wherein said pump includes a magnetically driven impeller.

8. The apparatus for liquid cooling a video projector according to claim 1 wherein said pump motor is shielded for operation within an MRI fringe magnetic field.

9. The apparatus for liquid cooling a video projector according to claim 1 wherein said heat sink block and said pump are coupled together by use of flexible tubing sized to dissipate heat from said projector light by heat transfer along a predefined length of said tubing.

10. The apparatus for liquid cooling a video projector according to claim 8 wherein flexible tubing is of a predetermined thickness to increase heat dissipation.

11. The apparatus for liquid cooling a video projector according to claim 1 wherein said heat sink block is constructed from a copper material.

12. The apparatus for liquid cooling a video projector according to claim 1 including a heat sink attached to said optical engine and a thermal bridge coupled to said heat sink block.

13. An apparatus for use in cooling a video projector light source in an MRI environment, the apparatus comprising:
    a heat sink block having an internal chamber with an inlet and an outlet, said heat sink block constructed and arranged for securement to a video projector light source mounted within a video projector housing;
    a fluid pump positioned at least ten feet from said video projector housing, said fluid pump having an outtake coupled to said heat sink block input by a first flexible tube, and said pump intake is coupled to said heat sink output by a second flexible tube;
    a pump motor electrically coupled to said video projector to cause operation of said pump for recirculating fluid between said pump and heat sink block when the video light source is operating;
    and a liquid reservoir for use in maintaining a fluid level within the recirculating fluid;
    wherein heat from an LCOS, LPD, LED or the like projector light source secured to said heat sink block is transferred to the fluid and dissipated during the recirculation of the fluid.

14. The apparatus for liquid cooling a video projector according to claim 13 wherein said heat sink block and said pump intake is fluidly coupled to a lower section of said liquid reservoir.

15. The apparatus for liquid cooling a video projector according to claim 13 including a means for illuminating the fluid level in said reservoir.

16. The apparatus for liquid cooling a video projector according to claim 13 wherein said fluid reservoir is constructed to eliminate air from the recirculation and includes a fill port for maintaining fluid capacity and a view port for determining fluid capacity.

17. The apparatus for liquid cooling a video projector according to claim 13 wherein said pump includes a magnetically driven impeller.

18. The apparatus for liquid cooling a video projector according to claim 13 wherein said pump motor is shielded for operation within an MRI fringe magnetic field.

19. The apparatus for liquid cooling a video projector according to claim 13 wherein flexible tubing is of a predetermined thickness to increase heat dissipation.

20. The apparatus for liquid cooling a video projector according to claim 13 including a heat sink attached to said optical engine coupled to said heat sink block by a thermal bridge.

* * * * *